US008426741B2

(12) United States Patent
Yamazaki

(10) Patent No.: US 8,426,741 B2
(45) Date of Patent: Apr. 23, 2013

(54) PHOTOSENSITIVE CONDUCTIVE FILM, METHOD FOR FORMING CONDUCTIVE FILM, METHOD FOR FORMING CONDUCTIVE PATTERN, AND CONDUCTIVE FILM SUBSTRATE

(75) Inventor: Hiroshi Yamazaki, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 13/046,544

(22) Filed: Mar. 11, 2011

(65) Prior Publication Data
US 2011/0165514 A1    Jul. 7, 2011

Related U.S. Application Data

(62) Division of application No. 13/060,114, filed as application No. PCT/JP2009/063187 on Jul. 23, 2009.

(30) Foreign Application Priority Data

Aug. 22, 2008   (JP) ................... P2008-214113

(51) Int. Cl.
H05K 1/03 (2006.01)
(52) U.S. Cl.
USPC ............................ 174/255; 29/840
(58) Field of Classification Search .......... 174/255, 174/256–259; 29/830, 840
See application file for complete search history.

(56) References Cited

U.S. PATENT DOCUMENTS

2007/0074316 A1   3/2007   Alden et al.

FOREIGN PATENT DOCUMENTS

| CN | 101292362 | 10/2008 |
|---|---|---|
| JP | 2006-012737 | 1/2006 |
| JP | 2006-69848 | 3/2006 |
| JP | 2006-140264 | 6/2006 |
| JP | 2006-344479 | 12/2006 |
| JP | 2007-257963 | 10/2007 |
| JP | 2007-257964 | 10/2007 |
| JP | 2007-308688 | 11/2007 |
| JP | 2008-159581 | 7/2008 |
| TW | 560017 | 11/2003 |
| TW | I225762 | 12/2004 |
| TW | I226115 | 1/2005 |
| TW | I260189 | 8/2006 |
| TW | I266568 | 11/2006 |

OTHER PUBLICATIONS

Translation of the International Preliminary Report on Patentability dated Mar. 17, 2011, for international Application No. PCT/JP2009/063187, filed Jul. 23, 2009.
Extended European Search Report dated Jul. 15, 2011, including Supplementary European Search Report and European Search Opinion, for EP Application No. 09808160.7-2205/2320433 (PCT/JP2009/063187).
Taiwanese Official Action (Notice of Allowance) dated Dec. 13, 2012, for TW Application No. 098126580.

*Primary Examiner* — Jeremy Norris
(74) *Attorney, Agent, or Firm* — Antonelli, Terry, Stout & Kraus, LLP.

(57) ABSTRACT

A photosensitive conductive film 10 according to the invention includes a support film 1, a conductive layer 2 containing conductive fiber formed on the support film 1, and a photosensitive resin layer 3 formed on the conductive layer 2.

19 Claims, 2 Drawing Sheets

(a)

(b)

(c)

PHOTOSENSITIVE CONDUCTIVE FILM, METHOD FOR FORMING CONDUCTIVE FILM, METHOD FOR FORMING CONDUCTIVE PATTERN, AND CONDUCTIVE FILM SUBSTRATE

This application is a Divisional application of application Ser. No. 13/060,114, filed Mar. 11, 2011, the contents of which are incorporated herein by reference in their entirety. Ser. No. 13/060,114 is a National Stage application, filed under 35 USC 371, of No. PCT/JP2009/063187, filed Jul. 23, 2009.

TECHNICAL FIELD

The present invention relates to a photosensitive conductive film, a method for forming a conductive film, a method for forming a conductive pattern, and a conductive film substrate; and particularly to a method for forming a conductive pattern to be used as an electrode interconnection of an apparatus, such as a flat panel display with a liquid crystal display element, etc., a touch screen and a solar cell, and a conductive film substrate.

BACKGROUND ART

For a larger electronic device, such as a personal computer and a television, a car navigation device, a cell phone, a smaller electronic device such as an electronic dictionary, and a display device of an OA/FA device, use of a liquid crystal display element or a touch screen has become popular. In such a liquid crystal display element and a touch screen, as well as a device such as a solar cell, a transparent conductive film is used for a part of an interconnection, a pixel electrode or a terminal, which requires transparency.

As a material for a transparent conductive film, ITO (Indium-Tin-Oxide), indium oxide and tin oxide, which exhibit high transmittance for visible light, have been heretofore used. For an electrode of a substrate for a liquid crystal display element, a patterned transparent conductive film consisting of the above material has become mainstream.

As a patterning method of a transparent conductive film is common a method by which after the formation of a transparent conductive film, a resist pattern is formed by a photolithography, and a predetermined part of the conductive film is removed by wet etching to form a conductive pattern. In the case of an ITO and indium oxide film, a mixture solution consisting of 2 liquids of hydrochloric acid and ferric chloride is commonly used as an etching solution.

An ITO film or a tin oxide film is formed generally by a sputtering method. By this method, however, the properties of the transparent conductive film change sensitively depending on the difference of the sputtering method, a power or gas pressure of a sputter, a substrate temperature, or a type of the atmospheric gas. The difference of the film quality of a transparent conductive film caused by a fluctuation of the sputtering conditions can cause fluctuation in the etching speed, when the transparent conductive film is subjected to wet etching, which may lead to a lower product yield by reason of poor patterning. Further, the above method for forming a conductive pattern must go through a step of sputtering, a step of forming resist, and a step of etching, and therefore the process is long, which constitutes a heavy burden costwise.

To solve the above problem, an attempt has been made recently to use an alternative material to ITO, indium oxide, tin oxide, etc. to form a transparent conductive pattern. For example, in the following Patent Literature 1 is disclosed a method for forming a conductive pattern, by which a conductive layer containing conductive fiber such as silver fiber is formed on a substrate, then a photosensitive resin layer is formed on the conductive layer, the former is exposed to light from above through a pattern mask, and developed.

CITATION LIST

Patent Literature

Patent Literature 1: U.S. Patent Application Publication No. 2007/0074316

SUMMARY OF INVENTION

Problems to be Solved by the Invention

However, according to the study of the present inventor, it has been known that, by the method described in the Patent Literature 1, the surface resistivity of a conductive pattern can hardly be made to low resistivity, while assuring the adherence between a substrate and a conductive pattern. Further, in case the conductive pattern is used as an interconnection, a pixel electrode or a terminal, a step of removing a photosensitive resin layer is required, and there arises a problem that a process for forming a conductive pattern becomes complex.

The present invention has been made in view of the problems involved in the conventional art, with objects to provide a photosensitive conductive film enabling with ease formation, on a substrate, of a sufficiently high resolution conductive pattern having sufficient adherence with the substrate and sufficiently low surface resistivity; as well as a method for forming a conductive film using the photosensitive conductive film; a method for forming a conductive pattern; and a conductive film substrate.

Means for Solving the Problems

To solve the problem, the present invention provides a photosensitive conductive film comprising a support film, a conductive layer containing conductive fiber formed on the support film, and a photosensitive resin layer formed on the conductive layer.

With a photosensitive conductive film according to the present invention by reason of having the above constitution, it becomes possible to form a conductive pattern having sufficient adherence with a substrate and sufficiently low surface resistivity at a sufficient resolution by a simple process, in which a photosensitive conductive film is laminated so that a photosensitive resin layer is tightly attached onto a substrate, and the same is then exposed and developed.

With respect to the photosensitive conductive film according to the present invention, the minimum light transmittance in a wavelength range of 450 to 650 nm of a laminate of the conductive layer and the photosensitive resin layer is preferably 80% or higher, provided that the total film thickness of the two layers is set at 1 to 10 µm. In case the conductive layer and the photosensitive resin layer satisfy the above conditions, higher brightness of a display panel, etc. becomes easy to achieve.

With respect to the photosensitive conductive film according to the present invention, the conductive fiber is preferably silver fiber from a viewpoint of easiness in adjusting the conductivity of the conductive film to be formed.

It is preferable that the photosensitive resin layer contains a binder polymer, a photopolymerizable compound having an ethylenic unsaturated bond, and a photopolymerization initiator, from a standpoint of further improving the adherence between the substrate and the conductive pattern, and the patterning property of the conductive film.

The present invention provides further a method for forming a conductive film comprising a lamination step of laminating the photosensitive conductive film according to the present invention so that the photosensitive resin layer is tightly attached onto a substrate; and an exposure step of irradiating the photosensitive resin layer on the substrate with actinic light.

According to the method for forming a conductive film according to the present invention, a conductive film having sufficient adherence with a substrate and sufficiently low surface resistivity can be easily formed on a substrate by using the photosensitive conductive film according to the present invention and conducting the above steps.

The present invention provides further a method for forming a conductive pattern comprising a step of laminating the photosensitive conductive film according to the present invention so that the photosensitive resin layer is tightly attached onto a substrate; an exposure step of irradiating a predetermined part of the photosensitive resin layer on the substrate with actinic light; and a development step of developing the exposed photosensitive resin layer to form a conductive pattern.

According to the method for forming a conductive pattern, a conductive pattern having sufficient adherence with a substrate and sufficiently low surface resistivity can be formed on a substrate simply and at a sufficient resolution by using the photosensitive conductive film according to the present invention and conducting the above steps.

The present invention provides further a conductive film substrate comprising a substrate and a conductive film formed on the substrate by the method for forming a conductive film according to the present invention.

The present invention provides further a conductive film substrate comprising a substrate and a conductive pattern formed on the substrate by the method for forming a conductive pattern according to the present invention.

With respect to the conductive film substrate according to the present invention, the surface resistivity of the conductive film or the conductive pattern is preferably 2000 Ω/square or less.

Effect of the Invention

According to the present invention, a photosensitive conductive film enabling with ease formation, on a substrate, of a sufficiently high resolution conductive pattern having sufficient adherence with the substrate and sufficiently low surface resistivity; as well as a method for forming a conductive film using the photosensitive conductive film; a method for forming a conductive pattern; and a conductive film substrate, can be provided.

DESCRIPTION OF EMBODIMENTS

Favorable embodiments of the present invention will be described below in detail. Meanwhile, "(meth)acrylate" herein means "acrylate" and the corresponding "methacrylate". Similarly, "(meth)acryl" means "acryl" and the corresponding "methacryl", and "(meth)acryloyl" means "acryloyl" and the corresponding "methacryloyl".

Figure 1:
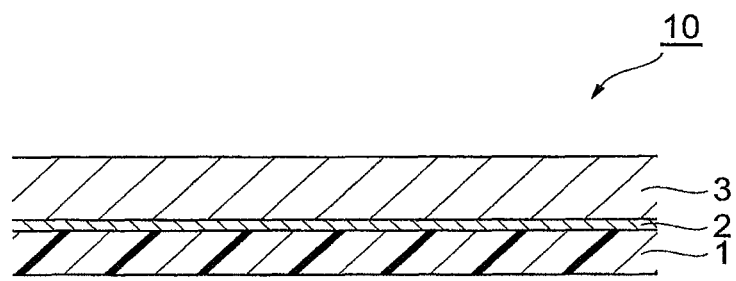
FIG. 1 is a schematic cross-section showing an embodiment of a photosensitive conductive film according to the present invention.

FIG. 1 is a schematic cross-section showing a favorable embodiment of a photosensitive conductive film according to the present invention. A photosensitive conductive film 10 in FIG. 1 includes a support film 1, a conductive layer 2 containing conductive fiber provided on the support film 1, and a photosensitive resin layer 3 provided on the conductive layer 2.

The support film 1, the conductive layer 2 containing conductive fiber, and the photosensitive resin layer 3, constituting the photosensitive conductive film 10 will each be described in detail below.

Examples of the support film 1 includes a polymer film having heat resistance and solvent resistance, such as a polyethylene terephthalate film, a polyethylene film, a polypropylene film, and a polycarbonate film. Among them, from a standpoint of transparency and heat resistance, a polyethylene terephthalate film is preferable. Meanwhile, the polymer films must be strippable later from a photosensitive resin layer, they must not be subjected to a surface treatment, or use a material, by which stripping becomes impossible.

The thickness of the support film 1 is preferably 5 to 300 µm, more preferably 10 to 200 µm, and especially preferably 15 to 100 µm. In case the thickness of the support film is less than 5 the mechanical strength is lowered, and the support film tends to tear easily at a step of coating a dispersion liquid of conductive fiber to form the conductive layer 2 or a photosensitive resin composition to form the photosensitive resin layer 3, or a step of delaminating the support film before developing the exposed photosensitive resin layer 3. While, in case the thickness of the support film exceeds 300 µl, the resolution of a pattern tends to decrease, when the photosensitive resin layer is irradiated with actinic light through the support film, and further the cost tends to increase.

The haze value of the support film 1 is preferably 0.01 to 5.0% from a standpoint of good sensitivity and resolution, more preferably 0.01 to 3.0%, especially preferably 0.01 to 2.0%, and extremely preferably 0.01 to 1.0%. Meanwhile, the haze value may be measured according to JIS K 7105, and can be measured by a commercially available haze meter, such as NDH-1001DP (Trade name, by Nippon Denshoku Industries, Co., Ltd.)

Examples of conductive fiber to be contained in the conductive layer 2 include metal fiber, such as gold, silver, and platinum, and carbon fiber such as carbon nanotube. Either one thereof singly, or a combination of two or more thereof may be used. From a standpoint of conductivity, use of gold fiber or silver fiber is preferable. Either one of gold fiber and silver fiber singly, or a combination of two or more thereof may be used. Further, from a standpoint of easy regulation of the conductivity of a conductive film to be formed, silver fiber is more preferable.

The metal fiber can be prepared, for example, by a method of reducing a metal ion by a reducing agent such as $NaBH_4$, or a polyol method.

As carbon nanotube, a commercially available product, such as HiPco monolayer carbon nanotube by Unidym, Inc., can be used.

The fiber diameter of conductive fiber is preferably 1 nm to 50 nm, more preferably 2 nm to 20 nm, and especially preferably 3 nm to 10 nm. The fiber length of the conductive fiber is preferably 1 µm to 100 µm, more preferably 2 µm to 50 µm, and especially preferably 3 µm to 10 µm. The fiber diameter and fiber length can be measured by a scanning electron microscope.

The thickness of the conductive layer 2, which may vary depending on the use or the required conductivity of a conductive film or a conductive pattern to be formed using a photosensitive conductive film according to the present invention, is preferably 1 µm or less, more preferably 1 nm to 0.5 µm, and especially preferably 5 nm to 0.1 µm. In case the thickness of the conductive layer 2 is 1 µm or less, the light transmittance in a wavelength range of 450 to 650 nm is high, and the pattern formability is also excellent, which is favorable especially for producing a transparent electrode.

The conductive layer 2 has preferably a network structure formed by contacting conductive fibers each other. The conductive layer 2 with such a network structure may be constructed on a surface of the photosensitive resin layer 3 facing the support film, but it may also be constructed in a form to be embedded in a surface layer of the photosensitive resin layer 3 facing the support film, as long as a surface to become exposed by delaminating the support film is conductive in the direction of the surface plane. The thickness of the conductive layer 2 with a network structure means a value measured by a scanning electron micrograph.

The conductive layer 2 containing conductive fiber can be formed, for example, by coating a conductive fiber dispersion liquid containing the aforedescribed conductive fiber, water and/or an organic solvent, and according to need a dispersion stabilizer such as a surfactant, onto the support film 1, followed by drying. After drying, the conductive layer 2 formed on the support film 1 may be laminated, according to need. Coating may be carried out by a publicly known method, such as a roll coating method, a comma coating method, a gravure coating method, an air knife coating method, a die coating method, a bar coating method, and a spray coating method. Further, drying may be carried out at 30 to 150° C. for about 1 to 30 min in a hot air convection drier, etc. In the conductive layer 2, the conductive fiber may coexist with a surfactant and a dispersion stabilizer.

Examples of the photosensitive resin layer 3 include those prepared from a photosensitive resin composition containing (a) a binder polymer, (b) a photopolymerizable compound having an ethylenic unsaturated bond, and (c) a photopolymerization initiator.

Examples of (a) a binder polymer include an acrylic resin, a styrene resin, an epoxy resin, an amide resin, an amide-epoxy resin, an alkyd resin, a phenol resin, an ester resin, a urethane resin, an epoxy acrylate resin obtained by a reaction between an epoxy resin and (meth)acrylic acid, and an acid-modified epoxy acrylate resin obtained by a reaction between an epoxy acrylate resin and an acid anhydride. Either one of the resins singly, or a combination of two or more thereof may be used. From a standpoint of a good alkali development property and film formation property, it is preferable to use an acrylic resin, and more preferable that the acrylic resin has as constituent units monomer units derived from (meth)acrylic acid and a (meth)acrylic acid alkyl ester. The term "acrylic resin" means a polymer having mainly a monomer unit derived from a polymerizable monomer having a (meth)acrylic group. Further, herein "(meth)acrylic acid" means "acrylic acid" and the corresponding "methacrylic acid", and a "(meth)acrylic acid alkyl ester" means an "acrylic acid alkyl ester" and the corresponding "methacrylic acid alkyl ester".

As the acrylic resin, one produced by a radical polymerization of a polymerizable monomer having a (meth)acrylic group can be used. Either one of the acrylic resin singly, or a combination of two or more thereof may be used.

Examples of the polymerizable monomer having a (meth)acrylic group include acrylamide such as diacetone acrylamide, a (meth)acrylic acid alkyl ester, (meth)acrylic acid tetrahydrofurfuryl ester, (meth)acrylic acid dimethylaminoethyl ester, (meth)acrylic acid diethylaminoethyl ester, (meth)acrylic acid glycidyl ester, 2,2,2-trifluoroethyl (meth)acrylate, 2,2,3,3-tetrafluoropropyl (meth)acrylate, (meth)acrylic acid, α-bromo(meth)acrylic acid, α-chloro(meth)acrylic acid, β-furyl (meth)acrylic acid, and β-styryl (meth)acrylic acid.

The acrylic resin may be copolymerized with one or two or more of polymerizable monomers, such as, in addition to the above polymerizable monomer having a (meth)acrylic group, styrene, a polymerizable derivative of styrene substituted at the α-position or in an aromatic ring (e.g., vinyl toluene and α-methylstyrene), acrylonitrile, esters of vinyl alcohol (e.g., vinyl-n-butyl ether), maleic acid, maleic anhydride, a maleic acid mono ester (e.g., monomethyl maleate, monoethyl maleate, monoisopropyl maleate), fumaric acid, cinnamic acid, α-cyanocinnamic acid, itaconic acid, and crotonic acid.

Examples of the (meth)acrylic acid alkyl ester include the compounds expressed by the following general formula (1) and compounds in which an alkyl group of the former compounds is substituted by a hydroxy group, an epoxy group, a halogen group, etc.

$$CH_2=C(R^1)-COOR^2 \quad (1)$$

In the formula $R^1$ represents a hydrogen atom or a methyl group, $R^2$ represents an alkyl group having 1 to 12 carbon atoms. Examples of the alkyl group having 1 to 12 carbon atoms include a methyl group, an ethyl group, a propyl group, a butyl group, a pentyl group, a hexyl group, a heptyl group, an octyl group, a nonyl group, a decyl group, an undecyl group, a dodecyl group and a structural isomer thereof.

Examples of the compounds expressed by the above general formula (1) include methyl (meth)acrylate, ethyl (meth)acrylate, propyl (meth)acrylate, butyl (meth)acrylate, pentyl (meth)acrylate, hexyl (meth)acrylate, heptyl (meth)acrylate, octyl (meth)acrylate, 2-ethylhexyl (meth)acrylate, nonyl (meth)acrylate, decyl (meth)acrylate, undecyl (meth)acrylate, and dodecyl (meth)acrylate. Either one thereof singly, or a combination of two or more thereof may be used.

Further, (a) a binder polymer should preferably have a carboxyl group from a standpoint of better alkali developability. Examples of a polymerizable monomer include (meth)acrylic acid as described above.

The content of a carboxyl group contained in a binder polymer in terms of the ratio of a polymerizable monomer having a carboxyl group to the total polymerizable monomers used, is preferably 12 to 50% by mass from a standpoint of well balanced alkali developability and alkali resistance, more preferably 12 to 40% by mass, especially preferably 15 to 30% by mass, and extremely preferably 15 to 25% by mass. In case the content of the polymerizable monomer having a carboxyl group is less than 12% by mass the alkali developability is apt to be poor, and in case it exceeds 50% by mass the alkali resistance is apt to be poor.

The weight-average molecular weight of the binder polymer is preferably 5,000 to 300,000 from a standpoint of well balanced mechanical strength and alkali developability, more preferably 20,000 to 150,000, and especially preferably 30,000 to 100,000. In case the weight-average molecular weight is less than 5,000, the resistance to a developing solution tends to decrease, and in case it exceeds 300,000, the developing time tends to extend. The weight-average molecular weight in the present invention is a value measured by a gel permeation chromatography method (GPC) and converted according to a calibration curve prepared by using a standard polystyrene.

Either one of the binder polymers singly, or a combination of two or more thereof may be used. In case a combination of two or more thereof is used, examples of the binder polymers include two or more binder polymers containing different comonomer constituents, two or more binder polymers having different weight-average molecular weights, and two or more binder polymers having different degrees of dispersion.

Next, (b) a photopolymerizable compound having an ethylenic unsaturated bond will be described.

As a photopolymerizable compound having an ethylenic unsaturated bond, a photopolymerizable compound having an ethylenic unsaturated bond is preferable. Examples of a photopolymerizable compound having an ethylenic unsaturated bond include a compound obtained by reacting polyhydric alcohol with α,β-unsaturated carboxylic acid, a bisphenol A type (meth)acrylate compound, such as a 2,2-bis(4-((meth)acryloxypolyethoxy)phenyl)propane, a 2,2-bis(4-((meth)acryloxypolypropoxy)phenyl)propane, and a 2,2-bis(4-((meth)acryloxypolyethoxypolypropoxy)phenyl)propane, a compound obtained by reacting a compound containing a glycidyl group with α,β-unsaturated carboxylic acid, a urethane monomer such as a (meth)acrylate compound having a urethane bond, γ-chloro-β-hydroxypropyl-β'-(meth)acryloyloxyethyl-o-phthalate, β-hydroxyethyl-β'-(meth)acryloyloxyethyl-o-phthalate, β-hydroxypropyl-β'-(meth)acryloyloxyethyl-o-phthalate, and a (meth)acrylic acid alkyl ester. They may be used singly, or in combination of two or more thereof.

Examples of a 2,2-bis(4-((meth)acryloxypolyethoxy)phenyl)propane include 2,2-bis(4-((meth)acryloxydiethoxy)phenyl)propane, 2,2-bis(4-((meth)acryloxytriethoxy)phenyl)propane, 2,2-bis(4-((meth)acryloxytetraethoxy)phenyl)propane, 2,2-bis(4-((meth)acryloxypentaethoxy)phenyl)propane, 2,2-bis(4-((meth)acryloxyhexaethoxy)phenyl)propane, 2,2-bis(4-((meth)acryloxyheptaethoxy)phenyl)propane, 2,2-bis(4-((meth)acryloxyoctaethoxy)phenyl)propane, 2,2-bis(4-((meth)acryloxynonaethoxy)phenyl)propane, 2,2-bis(4-((meth)acryloxydecaethoxy)phenyl)propane, 2,2-bis(4-((meth)acryloxyundecaethoxy)phenyl)propane, 2,2-bis(4-((meth)acryloxydodecaethoxy)phenyl)propane, 2,2-bis(4-((meth)acryloxytridecaethoxy)phenyl)propane, 2,2-bis(4-((meth)acryloxytetraethoxy)phenyl)propane, 2,2-bis(4-((meth)acryloxypentadecaethoxy)phenyl)propane, and 2,2-bis(4-((meth)acryloxyhexadecaethoxy)phenyl)propane. Among them 2,2-bis(4-(methacryloxypentaethoxy)phenyl)propane is commercially available as "BPE-500" (Trade name, from Shin-Nakamura Chemical Co., Ltd.), and 2,2-bis(4-(methacryloxypentadecaethoxy)phenyl)propane is commercially available as "BPE-1300" (Trade name, from Shin-Nakamura Chemical Co., Ltd.). They may be used singly, or in combination of two or more thereof.

Examples of the compound obtained by reacting polyhydric alcohol with α,β-unsaturated carboxylic acid include a polyethylene glycol di(meth)acrylate with 2 to 14 ethylene groups, a polypropylene glycol di(meth)acrylate with 2 to 14 propylene groups, a polyethylene polypropylene glycol di(meth)acrylate with 2 to 14 ethylene groups and 2 to 14 propylene groups, trimethylol propane di(meth)acrylate, trimethylol propane tri(meth)acrylate, trimethylol propane ethoxytri(meth)acrylate, trimethylol propane di ethoxytri (meth)acrylate, trimethylol propane triethoxytri(meth)acrylate, trimethylol propane tetraethoxytri(meth)acrylate, trimethylol propane pentaethoxytri(meth)acrylate, tetramethylol methane tri(meth)acrylate, tetramethylol methane tetra(meth)acrylate, a polypropyleneglycol di(meth)acrylate with 2 to 14 propylene groups, dipentaerythritol penta(meth)acrylate, and dipentaerythritol hexa(meth)acrylate.

Examples of the urethane monomer include an addition product of (meth)acrylic monomer having a hydroxyl group at the β-position with a diisocyanate compound, such as isophorone diisocyanate, 2,6-toluene diisocyanate, 2,4-toluene diisocyanate, and 1,6-hexamethylene diisocyanate, tris [(meth)acryloxytetraethylene glycol isocyanate]hexamethylene isocyanurate, an EO-modified urethane di(meth)acrylate, and an EO, PO-modified urethane di(meth)acrylate. Meanwhile, "EO" stands for ethylene oxide, and an EO-modified compound has a block structure of ethylene oxide groups. "PO" stands for propylene oxide, and a PO-modified compound has a block structure of propylene oxide groups. Examples of an EO-modified urethane di(meth)acrylate include "UA-11" (Trade name, by Shin-Nakamura Chemical Co., Ltd.), and examples of an EO, PO-modified urethane di(meth)acrylate include "UA-13" (Trade name, by Shin-Nakamura Chemical Co., Ltd.).

The content of a photopolymerizable compound is preferably 30 to 80 parts by mass based on total 100 parts by mass of a binder polymer and a photopolymerizable compound, and more preferably 40 to 70 parts by mass. In case the content is less than 30 parts by mass, light curing becomes insufficient, and the coating property of a transferred conductive film (a conductive layer and a photosensitive resin layer) tends to become insufficient, and in case it exceeds 80 parts by mass, the storage of a wound-up film tends to become difficult.

Next, (c) a photopolymerization initiator will be described.

Examples of a photopolymerization initiator include an aromatic ketone, such as benzophenone, N,N'-tetramethyl-4,4'-diaminobenzophenone (Michler ketone), N,N'-tetraethyl-4,4'-diaminobenzophenone, 4-methoxy-4'-dimethylaminobenzophenone, 2-benzyl-2-dimethylamino-1-(4-morpholinophenyl)-butanone-1, and 2-methyl-1-[4-(methylthio)phenyl]-2-morpholino-propanone-1, a quinone, such as 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone, a benzoin ether compound, such as benzoin methyl ether, benzoin ethyl ether, and benzoin phenyl ether, a benzoin compound, such as benzoin, methylbenzoin, and ethylbenzoin, an oxime ester compound, such as 1,2-octanedione-1-[4-(phenylthio)phenyl]-2-(O-benzoyloxime), and 1-[9-ethyl-6-(2-methylbenzoyl)-9H-carbazol-3-yl]ethanone 1-(O-acetyloxime), a benzyl derivative, such as benzyldimethylketal, a 2,4,5-triarylimidazole dimer, such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer, and 2-(p-methoxyphenyl)-4,5-diphenylimidazole dimer, an acridine derivative, such as 9-phenylacridine, and 1,7-bis(9,9'-acridinyl)heptane, N-phenylglycine, an N-phenylglycine derivative, a coumarin type compound, and an oxazole type compound. The substituents of an aryl group of the two of 2,4,5-triarylimidazole may be identical to give a symmetric compound, or different to give an asymmetric compound. Further, a thioxanthone type compound and a tert-amine compound may be combined as a combination of diethylthioxanthone and dimethylaminobenzoic acid. Among them, from a standpoint of transparency, an aromatic ketone compound, such as 2-benzyl-2-dimethylamino-1-(4-morpholinophenyl)-butanone-1, and an oxime ester compound, such as 1,2-octanedione-1-[4-(phenylthio)phenyl]-2-(O-benzoyloxime), are more preferable. They may be used singly, or in combination of two or more thereof.

The content of a photopolymerization initiator is preferably 0.1 to 20 parts by mass based on total 100 parts by mass of a binder polymer and a photopolymerizable compound, more preferably 1 to 10 parts by mass, and especially preferably 1 to 5 parts by mass. In case the content is less than 0.1 parts by mass, the photosensitivity tends to become insufficient, and in case it exceeds 20 parts by mass, the absorption at the surface of a photosensitive resin layer on an occasion of exposure increases and the internal light curing tends to become insufficient.

According to need, to the photosensitive resin layer 3, an additive, such as a plasticizer (e.g., p-toluenesulfonamide), a filler, a defoaming agent, a flame retardant, a stabilizer, a tackifier, a leveling agent, a stripping agent, an antioxidant, a fragrance, an imaging agent, and a thermal cross-linking agent may be added singly, or in combination of two or more thereof. The addition amount of each additive is preferably 0.01 to 20 parts by mass based on total 100 parts by mass of a binder polymer and a photopolymerizable compound.

The photosensitive resin layer 3 can be formed, on the support film 1 with the conductive layer 2 formed thereon, by coating a photosensitive resin composition solution, whose solid content is about 10 to 60% by mass dissolved in a solvent of methanol, ethanol, acetone, methyl ethyl ketone, methylcellosolve, ethylcellosolve, toluene, N,N-dimethylformamide, propylene glycol monomethyl ether, or a mixture solvent thereof according to need, and followed by drying. In this connection, the content of a residual organic solvent in the photosensitive resin layer after drying is preferably 2% by mass or less, so as to prevent diffusion of the organic solvent at a later process step.

The coating can be conducted according to a publicly known method, such as a roll coating method, a comma coating method, a gravure coating method, an air knife coating method, a die coating method, a bar coating method, and a spray coating method. The drying after the coating to remove an organic solvent, etc. may be conducted at 70 to 150° C. for about 5 to 30 min by a hot air convection drier, etc.

The thickness of the photosensitive resin layer 3 may vary according to its application, and is preferably 1 to 200 µm as the thickness after drying, more preferably 1 to 15 µm, and especially preferably 1 to 10 µm. In case the thickness is less than 1 µm, the coating tends to become difficult, and in case it exceeds 200 µm, the sensitivity becomes insufficient due to decrease in light transmission and the light curing capability of the photosensitive resin layer to be transferred tends to decrease.

In a photosensitive conductive film according to the present embodiment, the minimum light transmittance in a wavelength range of 450 to 650 nm of a laminate of the conductive layer 2 and the photosensitive resin layer 3, when the total film thickness of the two layers is set at 1 to 10 µm, is preferably 80% or higher, and more preferably 85% or higher. In case the conductive layer and the photosensitive resin layer satisfy such conditions, higher brightness in a display panel, etc. becomes easy to achieve.

In a photosensitive conductive film according to the present invention, contacting the surface of the photosensitive resin layer 3 opposite to the surface facing the support film 1, a protection film can be laminated.

As a protection film, for example, a polymer film with heat resistance and solvent resistance, such as a polyethylene terephthalate film, a polypropylene film, and a polyethylene film, can be used. Further, as a protection film, a polymer film similar to the aforedescribed support film may be used.

The bond strength of the protection film with the photosensitive resin layer is preferably less than the bond strengths of the conductive layer 2 and the photosensitive resin layer 3 with the support film 1, so as to facilitate delamination of the protection film from the photosensitive resin layer.

Further, as for the protection film, the number of fish eyes with the diameter of 80 µm or larger in the protection film is preferably 5/m$^2$ or less. While, "fish eye" is a foreign substance in a material, an unmelted product, an oxidation degradation product, etc. included in a film, when the film is produced by hot melting, kneading and extruding a material, by a biaxial stretching or casting method, etc.

The thickness of the protection film is preferably 1 to 100 µm, more preferably 5 to 50 µm, further preferably 5 to 30 µm, and especially preferably 15 to 30 µm. In case the thickness of the protection film is less than 1 µm, the protection film tends to tear easily in laminating, and in case it exceeds 100 µm, the cost tends to increase.

The photosensitive conductive film may have an additional layer, such as an adhesive layer, and a gas barrier layer, on the support film.

The photosensitive conductive film may be stored, for example, as it is in a flat sheet form, or in the form of a roll obtained by winding it around an, e.g., cylindrical core. In the latter case, the film is preferably so wound that the support film comes to the outermost side.

In case the photosensitive conductive film does not have a protection film, such photosensitive conductive film can be stored as it is in a flat sheet form.

There is no particular restriction on a core, as long as it has been used heretofore. Examples thereof include a plastic, such as a polyethylene resin, a polypropylene resin, a polystyrene resin, a polyvinylchloride resin, and an ABS resin (acrylonitrile-butadiene-styrene copolymer). Further, at an end-face of the photosensitive conductive film wound in the form of a roll, an end separator is preferably provided from a standpoint of protecting the end-face, and further from a standpoint of the edge fusion resistance a moisture-proof end separator should be provided preferably. Further, in case a photosensitive conductive film is packaged, packaging in a low moisture permeability black sheet is preferable.

(Method for Forming Conductive Film)

A method for forming a conductive film according to the present invention includes a lamination step of laminating the photosensitive conductive film according to the present invention so that the photosensitive resin layer is tightly attached onto a substrate; and an exposure step of irradiating the photosensitive resin layer on the substrate with actinic light. In case the photosensitive conductive film has a protection film, the photosensitive conductive film delaminated of the protection film is laminated onto a substrate from the photosensitive resin layer side. By the lamination step, on the substrate, the photosensitive resin layer, the conductive layer and the support film are laminated in the order mentioned.

Examples of a substrate include a glass substrate, a plastic substrate, such as polycarbonate. The minimum light transmittance of the substrate in a wavelength range of 450 to 650 nm is preferably 80% or higher.

The lamination step is conducted, in case a protection film exists, after removing the same, for example, by a method of laminating the photosensitive conductive film under heating by pressing tightly the photosensitive resin layer side onto the substrate. Concerning this operation, the lamination is preferably conducted under a reduced pressure from a viewpoint of an adhesion property and a following-up property. For laminating the photosensitive conductive film, the photosensitive resin layer and/or the substrate is preferably heated to 70 to 130° C., and the pressing pressure is preferably about 0.1 to 1.0 MPa (about 1 to 10 kgf/cm$^2$), though there are no particular restrictions on the above conditions. In case the photosensitive resin layer is heated to 70 to 130° C. as above, the substrate is not required to be subjected to a preheating treatment in advance, but the substrate may be subjected to the preheating treatment to improve further the lamination property.

At the exposure step the photosensitive resin layer is cured by irradiation with actinic light, and the conductive layer is fixed by the cured substance to form a conductive film on the substrate. As a light source for the actinic light, a publicly known light source emitting effectively ultraviolet light, visible light, etc., such as an a carbon arc lamp, a mercury vapor arc lamp, an ultrahigh pressure mercury lamp, a high pressure mercury lamp, and a xenon lamp, is used. Further, an Ar ion laser, a semiconductor laser, etc., that emit effectively ultraviolet light, visible light, etc., can be also used. Furthermore, a photographic flood bulb, a sun lamp, etc., that emit effectively visible light can be also used.

In case the support film on the conductive layer is transparent to the actinic light, the irradiation with the actinic light through the support film is possible, and in case the support film is light-blocking, the photosensitive resin layer is irradiated with the actinic light after removal of the support film.

Further, in case the substrate is transparent to the actinic light, the irradiation with the actinic light from the substrate side through the substrate is possible, but in view of the resolution it is preferable to irradiate the conductive layer and the photosensitive resin layer from the conductive layer side with the actinic light.

Going through the above steps, the conductive film substrate provided with the conductive film on the substrate can be obtained. By a method for forming a conductive film according to the present embodiment, the formed conductive film may be additionally cured after delaminating the support film, according to need, by heating to about 60 to 250° C. or exposure at about 0.2 to 10 J/cm$^2$.

As described above, according to the method for forming the conductive film of the present invention, a transparent conductive film can be easily formed on a substrate made of glass, plastic or the like.

(Method for Forming Conductive Pattern)

Next, a method for forming a conductive pattern according to the present invention will be described by reference to the drawings.

Figure 2:
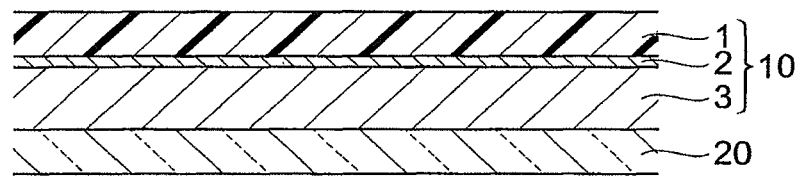
FIG. 2 is a schematic cross-section illustrating an embodiment of a method for forming a conductive pattern according to the present invention.
Figure 2:
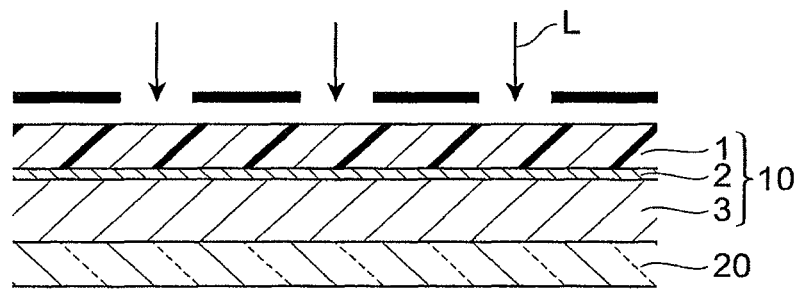
Figure 2:
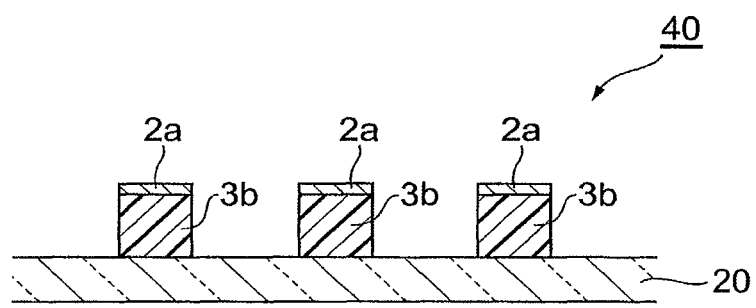

A method for forming a conductive pattern according to the present embodiment includes a step (FIG. 2 (*a*)) of laminating the photosensitive conductive film 10 so that the photosensitive resin layer 3 is tightly attached onto the substrate 20; an exposure step (FIG. 2 (*b*)) of irradiating a predetermined part of the photosensitive resin layer 3 on the substrate 20 with actinic light; and a development step of developing the exposed photosensitive resin layer 3 to form a conductive pattern. Going through the steps, a conductive film substrate 40 provided with a patterned conductive film (a conductive pattern) 2*a* on the substrate 20 can be obtained (FIG. 2 (*c*)).

The lamination step is conducted, in case a protection film exists, after removing the same, for example, by a method of laminating the photosensitive conductive film under heating by pressing tightly the photosensitive resin layer side onto the substrate. Concerning this operation, the lamination is preferably conducted under a reduced pressure from a viewpoint of an adhesion property and a following-up property. For laminating the photosensitive conductive film, the photosensitive resin layer and/or the substrate is preferably heated to 70 to 130° C., and the pressing pressure is preferably about 0.1 to 1.0 MPa (about 1 to 10 kgf/cm$^2$), though there are no particular restrictions on the above conditions. In case the photosensitive resin layer is heated to 70 to 130° C. as above, the substrate is not required to be subjected to a preheating treatment in advance, but the substrate may be subjected to the preheating treatment to improve further the lamination property.

Examples of an exposure method at the exposure step include a method (a mask exposure method), by which irradiation with actinic light is made through a negative or positive mask pattern, which is called as an artwork, in the form of an image. As a light source for the actinic light, a publicly known light source emitting effectively ultraviolet light, visible light, etc., such as an a carbon arc lamp, a mercury vapor arc lamp, an ultrahigh pressure mercury lamp, a high pressure mercury lamp, and a xenon lamp, is used. Further, an Ar ion laser, a semiconductor laser, etc., that emit effectively ultraviolet light, visible light, etc., can be also used. Furthermore, a photographic flood bulb, a sun lamp, etc., that emit effectively visible light can be also used. Furthermore, a method of irradiation with the actinic light in the form of an image by means of a direct writing method using a laser exposure method, etc. may be also adopted.

In case the support film on the conductive layer is transparent to the actinic light, the irradiation with the actinic light through the support film is possible, and in case the support film is light-blocking, the photosensitive resin layer is irradiated with the actinic light after removal of the support film.

Further, in case the substrate is transparent to the actinic light, the irradiation with the actinic light from the substrate side through the substrate is possible, but in view of the resolution it is preferable to irradiate the conductive layer and the photosensitive resin layer from the conductive layer side with the actinic light.

At the step of development according to the present embodiment, other part than the exposed part of the photosensitive resin layer is removed. More specifically, in case a transparent support film exists on the conductive layer, after removing the support film first, the part other than the exposed part of the photosensitive resin layer is removed by wet development. As a result, the conductive layer 2*a* containing conductive fiber remains on the cured resin layer 3*a* having a predetermined pattern to form a conductive pattern.

The wet development is conducted using a developing solution corresponding to a photosensitive resin, such as an alkaline aqueous solution, a water-based developing solution, and an organic solvent-based developing solution, according to a publicly known process, such as spraying, swinging immersion, brushing, and scraping.

As the developing solution, a solution such as an alkaline aqueous solution, which is safe and stable, as well as superior in usability, is utilized. Examples of a base for the alkaline aqueous solution to be utilized include an alkali hydroxide, such as a hydroxide of lithium, sodium or potassium; an alkali carbonate, such as a carbonate or a bicarbonate of lithium, sodium, potassium or ammonium; an alkali metal phosphate, such as potassium phosphate, and sodium phosphate; and an alkali metal pyrophosphate, such as sodium pyrophosphate, and potassium pyrophosphate.

As an alkaline aqueous solution used for development are preferable a 0.1 to 5% by mass aqueous solution of sodium carbonate, a 0.1 to 5% by mass aqueous solution of potassium carbonate, a 0.1 to 5% by mass aqueous solution of sodium hydroxide, a 0.1 to 5% by mass aqueous solution of sodium tetraborate, etc. The pH of an alkaline aqueous solution used for development is preferably adjusted to a range of 9 to 11, and the temperature thereof is regulated according to the developability of a photosensitive resin layer. In an alkaline aqueous solution, a surfactant, a defoaming agent, and a small amount of an organic solvent for promoting development may be admixed.

Further, a water-based developing solution composed of water or an alkaline aqueous solution and one or more organic solvents can be used. In this regard, examples of a base to be contained in the alkaline aqueous solution include, in addition to the aforedescribed bases, borax and sodium metasilicate, tetramethylammonium hydroxide, ethanolamine, ethylenediamine, diethylenetriamine, 2-amino-2-hydroxymethyl-1,3-propanediol, 1,3-diaminopropanol-2, and morpholine. Examples of the organic solvent include triacetone alcohol, acetone, ethyl acetate, an alkoxyethanol having an alkoxy group having 1 to 4 carbon atoms, ethyl alcohol, isopropyl alcohol, butyl alcohol, diethylene glycol monomethyl ether, diethylene glycol monoethyl ether, and diethylene glycol monobutyl ether. Either one thereof singly, or a combination of two or more thereof is used.

The concentration of an organic solvent in a water-based developing solution is preferably adjusted to 2 to 90% by mass, and the temperature thereof can be regulated according to the developability. Further, the pH of a water-based developing solution should be preferably selected as low as possible, as long as the development of a resist can be carried out sufficiently, and adjustment to pH 8 to 12 is preferable, more preferable to pH 9 to 10. In a water-based developing solution, a small amount of a surfactant, a defoaming agent, etc. can be admixed.

Examples of an organic solvent-based developing solution include 1,1,1-trichloroethane, N-methylpyrrolidone, N,N-dimethylformamide, cyclohexanone, methyl isobutyl ketone, and γ-butyrolactone. These organic solvents should preferably be used by adding water to a range of 1 to 20% by mass to avoid ignition.

The aforedescribed developing solutions may be used according to need in combination of two or more thereof.

Examples of a process for developing include a dipping process, a puddle process, a spraying process, brushing, and slapping. Among them the use of the high-pressure spraying process is preferable from a standpoint of improving the resolution.

In the method for forming a conductive pattern according to the present embodiment, the conductive pattern may be additionally cured according to need after the development by heating to about 60 to 250° C. or exposure at about 0.2 to 10 J/cm$^2$.

As described above, by the method for forming a conductive pattern according to the present invention, a transparent conductive pattern can be easily formed on a substrate made of glass, plastic or the like without forming an etching resist as for an inorganic film with ITO, etc.

A conductive film substrate according to the present invention can be obtained by the method for forming a conductive film or the method for forming a conductive pattern, and from a standpoint that the same can be utilized effectively as a transparent electrode, the surface resistivity of the conductive film or the conductive pattern is preferably 2000 Ω/square or less, more preferably 1000 Ω/square or less, and especially preferably 500 Ω/square or less. The surface resistivity can be regulated, for example, by the concentration of a conductive fiber dispersion liquid, or the coating amount.

Further, the minimum light transmittance of a conductive film substrate according to the present invention in a wavelength range of 450 to 650 nm is preferably 80% or higher, and more preferably 85% or higher.

EXAMPLES

The present invention will be described more specifically below based on Examples, provided that the present invention be not limited thereto.

<Preparation of Conductive Fiber Dispersion Liquid>

(Conductive Fiber Dispersion Liquid 1 (Carbon Nanotube Dispersion Liquid))

Into purified water were dispersed a high purity product of Hipco monolayer carbon nanotube (by Unidym, Inc.) to the concentration of 0.4% by mass, and dodecyl-pentaethylene glycol as a surfactant to 0.1% by mass, to obtain a conductive fiber dispersion liquid 1.

(Conductive Fiber Dispersion Liquid 2 (Silver Fiber Dispersion Liquid))

[Preparation of Silver Fiber by Polyol Method]

In a 2000 mL 3-necked flask, 500 mL of ethylene glycol was charged, which was then heated to 160° C. in an oil bath under a nitrogen atmosphere with stirring by a magnetic stirrer. A solution prepared separately by dissolving 2 mg of $PtCl_2$ in 50 mL of ethylene glycol was dropped into the flask. After 4 to 5 min a solution with 5 g of $AgNO_3$ dissolved in 300 mL of ethylene glycol, and a solution with 5 g of polyvinylpyrrolidone having the weight-average molecular weight of 40,000 (by Wako Pure Chemical Industries, Ltd.) dissolved in 150 mL of ethylene glycol were dropped by separate dropping funnels over 1 min, and the liquid was stiffed at 160° C. for 60 min.

The above reaction solution was left standing to 30° C. or less, then diluted 10-fold by acetone, and centrifuged by a centrifuge at 2000 rpm for 20 min to decant the supernatant liquid. Acetone was added to the sediment, and after stirring, the mixture was centrifuged under the similar conditions as above to decant the acetone. Thereafter, the similar centrifugation was repeated twice using distilled water to obtain silver fiber. According to observation of the obtained silver fiber under a light microscope, the fiber diameter was about 5 nm and the fiber length was about 5 μm.

[Preparation of Silver Fiber Dispersion Liquid]

In purified water were dispersed the thus obtained silver fiber to the concentration of 0.2% by mass, and dodecyl-pentaethylene glycol to 0.1% by mass, thereby obtaining a conductive fiber dispersion liquid 2.

<Preparation of Photosensitive Resin Composition Solution>

<Synthesis of Acrylic Resin>

Into a flask equipped with a stirrer, a reflux condenser, a thermometer, a dropping funnel and a nitrogen gas feed tube was charged 400 g of a mixture liquid of methyl cellosolve and toluene (methyl cellosolve/toluene=3/2 (mass ratio), hereinafter referred to as "solution s"), which was then stirred while feeding nitrogen gas and heated to 80° C. Meanwhile, a solution of the mixture of 100 g of methacrylic acid, 250 g of methyl methacrylate, 100 g of ethyl acrylate and 50 g of styrene, a well as 0.8 g of azobisisobutyronitrile (hereinafter referred to as "solution a") as monomers was prepared. Next, to the solution s heated to 80° C. was dropped the solution a over 4 hours, and the mixture was incubated with stirring at 80° C. for 2 hours. Further, a solution with 1.2 g of azobisisobutyronitrile dissolved in 100 g of the solution s was dropped into the flask over 10 min. Then the solution after the dropping was incubated at 80° C. for 3 hours, and heated up to 90° C. over 30 min. The solution was incubated at 90° C. for 2 hours, and then cooled down to obtain a binder polymer solution. To the binder polymer solution was added acetone to adjust the solution so that a nonvolatile component (solid content) had 50% by mass, to obtain a binder polymer solution as the (a) component. The weight-average molecular weight of the obtained binder polymer was 80,000, which was designated as the acrylic polymer A.

The materials shown in Table 1 were mixed according to the contents (unit: parts by mass) shown in the table to prepare a solution of a photosensitive resin composition.

TABLE 1

| Component | Material identification (Abbreviation) | Content (parts by mass) |
|---|---|---|
| (a) Binder polymer | Acrylic polymer A [1] | 120 (solid content 60) |
| (b) Photopolymerizable compound having an ethylenic unsaturated bond | Pentaerythritol triacrylate (Trade name: A-TMPT by Shin-Nakamura Chemical Co., Ltd.) | 40 |
| (c) Photopolymerization initiator | 2-Benzyl-2-dimethylamino-1-(4-morpholinophenyl)-butanone-1 (Trade name: Irgacure 369, by Ciba Specialty Chemicals) | 2 |
| Others | Methyl ethyl ketone | 120 |

[1] An acrylic polymer with the weight ratio of methacrylic acid:methyl methacrylate:ethyl acrylate:and styrene = 20:50:20:10.

<Preparation of Photosensitive Conductive Film—1>

Example 1

The conductive fiber dispersion liquid 1 obtained as above was coated uniformly at 25 g/m$^2$ onto a 50 μm-thick polyethylene terephthalate film (PET film, Trade name "G2-50", by Teijin Limited) as a support film, dried in a hot air convection drier at 100° C. for 3 min, and pressed at a linear pressure of 10 kg/cm at room temperature to form a conductive layer on the support film. The film thickness of the conductive layer after drying was about 0.02 μm.

Next, the solution of the photosensitive resin composition was coated uniformly onto the 50 μm-thick polyethylene terephthalate film, on which the conductive layer had been formed, and dried in a hot air convection drier at 100° C. for 10 min to form a photosensitive resin layer. Thereafter the photosensitive resin layer was covered by a polyethylene protection film (Trade name "NF-13", by Tamapoly Co., Ltd.) to obtain a photosensitive conductive film. The film thickness of the photosensitive resin layer after drying was 5 μm.

Example 2

The conductive fiber dispersion liquid 2 obtained as above was coated uniformly at 25 g/m$^2$ onto a 50 μm-thick polyethylene terephthalate film (PET film, Trade name "G2-50", by Teijin Limited) as a support film, dried in a hot air convection drier at 100° C. for 10 min, and pressed at a linear pressure of 10 kg/cm at room temperature to form a conductive layer on the support film. The film thickness of the conductive layer after drying was about 0.01 μm.

Next, the solution of the photosensitive resin composition was coated uniformly onto the 50 μm-thick polyethylene terephthalate film, on which the conductive layer had been formed, and dried in a hot air convection drier at 100° C. for 10 min to form a photosensitive resin layer. Thereafter the photosensitive resin layer was covered by a polyethylene protection film (Trade name "NF-13", by Tamapoly Co., Ltd.) to obtain a photosensitive conductive film. The film thickness of the photosensitive resin layer after drying was 5 μm.

<Formation of Conductive Film>

Polycarbonate substrates with the thickness of 1 mm were heated to 80° C., and on the surfaces thereof the photosensitive conductive films obtained in Examples 1 and 2 were laminated by delaminating the protection film with the photosensitive resin layer facing the substrate under the conditions of 120° C. and 0.4 MPa. After the lamination, the substrates were cooled, and when the substrate temperature reached 23° C., the conductive layers and the photosensitive resin layers were irradiated with light from the support film side using an exposure machine with a high pressure mercury lamp (Trade name "HMW-201B", by Orc Manufacturing Co., Ltd.) at the exposure dose of 1000 mJ/cm$^2$. After the exposure, they were left standing at room temperature (25° C.) for 15 min, and then the PET films as the support film were delaminated to form conductive films containing carbon nanotube or silver fiber on the polycarbonate substrates. The surface resistivities of the respective conductive films were 2000 Ω/square and 500 Ω/square, and the minimum light transmittances (including the substrates) in a wavelength range of 450 to 650 nm were 80%, and 85%.

Identically as above, except that the substrate was changed to a 0.7 mm-thick soda-lime glass plate, the conductive films were formed on the glass substrate using the photosensitive conductive films obtained in Examples 1 and 2. The surface resistivities of the respective conductive films were 2000 Ω/square and 500 Ω/square, and the minimum light transmittances (including the substrates) in a wavelength range of 450 to 650 nm were 82%, and 87%. Meanwhile, the surface resistivity and the transmittance were measured according to the following methods.

[Measurement of Surface Resistivity]

The surface resistivity was measured using a low resistivity meter (Loresta GP, by Mitsubishi Chemical Corporation) by a 4-point probe technique according to JIS K 7194.

[Measurement of Light Transmittance]

The light transmittance at 450 nm, 550 nm and 650 nm, and the minimum light transmittances in a wavelength range of 450 to 650 nm were measured using a spectrophotometer (Trade name "U-3310", by Hitachi High-Technologies Corporation).

<Preparation of Photosensitive Conductive Film—2>

Example 3

A conductive layer was formed identically with Example 1, and a photosensitive conductive film was produced identically with Example 1, except that a photosensitive resin layer was so formed to make the total film thickness of the conductive layer and the photosensitive resin layer to 10 μm.

Example 4

A conductive layer was formed identically with Example 2, and a photosensitive conductive film was produced identically with Example 2, except that a photosensitive resin layer was so formed to make the total film thickness of the conductive layer and the photosensitive resin layer to 10 μm.

<Evaluation of Light Transmittance>

The photosensitive conductive film obtained as above was laminated on the 1 mm-thick polycarbonate substrate heated to 80° C. by delaminating the protection film with the photosensitive resin layer facing the substrate under the conditions of 120° C. and 0.4 MPa. After the lamination, the substrate was cooled, and when the substrate temperature reached 23° C., the conductive layer and the photosensitive resin layer were irradiated with light from the support film side using an exposure machine with a high pressure mercury lamp (Trade name "HMW-201B", by Orc Manufacturing Co., Ltd.) at the exposure dose of 1000 mJ/cm². After the exposure the laminate was left standing at room temperature (25° C.) for 15 min, then the PET film, namely the support film, was delaminated to form a conductive film containing carbon nanotube or silver fiber on the polycarbonate substrate.

Using a polycarbonate substrate alone as a reference, the light transmittance at 450 nm, 550 nm and 650 nm, and the minimum light transmittance in a wavelength range of 450 to 650 nm of the conductive layer containing conductive fiber and the photosensitive resin layer were measured using a spectrophotometer (Trade name "U-3310", by Hitachi High-Technologies Corporation). The evaluation results are shown in Table 2.

TABLE 2

|  |  | Example 3 | Example 4 |
|---|---|---|---|
| Conductive fiber |  | Carbon nanotube | Silver fiber |
| Thickness of conductive layer (μm) |  | 0.02 | 0.01 |
| Total film thickness of conductive layer and photosensitive resin layer (μm) |  | 10 | 10 |
| Minimum light transmittance in a wavelength range of 450 to 650 nm (%) |  | 80.4 | 89.1 |
| Light transmittance (%) | Wavelength 450 nm | 80.4 | 89.1 |
|  | Wavelength 550 nm | 84.5 | 93.7 |
|  | Wavelength 650 nm | 85.8 | 94.8 |

<Formation of Conductive Pattern>

Polycarbonate substrates with the thickness of 1 mm were heated to 80° C., and on the surfaces thereof the photosensitive conductive films obtained in Examples 1 and 2 were laminated by delaminating the protection film with the photosensitive resin layer facing the substrate under the conditions of 120° C. and 0.4 MPa. After the lamination, the substrate was cooled, and when the substrate temperature reached 23° C., a photomask having an interconnection pattern of the line width/space width of 100/100 μm and the length of 100 mm was tightly attached onto the surface of the PET film, namely the support film. Then the conductive layer and the photosensitive resin layer were irradiated with light using an exposure machine with a high pressure mercury lamp (Trade name "HMW-201B", by Orc Manufacturing Co., Ltd.) at the exposure dose of 200 mJ/cm².

After the exposure the laminate was left standing at room temperature (25° C.) for 15 min, then the PET film, namely the support film, was delaminated and developed by spraying a 1% by mass aqueous solution of sodium carbonate at 30° C. for 30 sec. After the development, a conductive pattern having a line width/space width of about 100/100 μm of the conductive film containing carbon nanotube or silver fiber was formed on the polycarbonate substrate. It was confirmed that the respective conductive patterns were formed satisfactorily.

INDUSTRIAL APPLICABILITY

According to the present invention, a photosensitive conductive film enabling with ease formation, on a substrate, of a sufficiently high resolution conductive pattern having sufficient adherence with the substrate and sufficiently low surface resistivity; as well as a method for forming a conductive film using the photosensitive conductive film; a method for forming a conductive pattern; and a conductive film substrate can be provided.

EXPLANATION OF REFERENCE NUMERALS

1 . . . Support film, 2 . . . Conductive layer, 2a . . . Conductive pattern, 3 . . . Photosensitive resin layer, 3a . . . Cured resin layer, 10 . . . Photosensitive conductive film, 20 . . . Substrate, 30 . . . Artwork, 40 . . . Conductive film substrate.

The invention claimed is:

1. A photosensitive conductive film comprising a support film, a conductive layer containing conductive fiber formed on the support film, and a photosensitive resin layer formed on the conductive layer,
   wherein the photosensitive resin layer comprises a binder polymer having a carboxyl group, a photopolymerizable compound having an ethylenic unsaturated bond, and a photopolymerization initiator.

2. The photosensitive conductive film according to claim 1, wherein a minimum light transmittance in a wavelength range of 450 to 650 nm of a laminate of the conductive layer and the photosensitive resin layer is 80% or higher, provided that a total film thickness of the two layers is set at 1 to 10 μm.

3. The photosensitive conductive film according to claim 1, wherein the conductive fiber is silver fiber.

4. The photosensitive conductive film according to claim 1, wherein the conductive fiber is at least one selected from a group consisting of metal fiber and carbon fiber.

5. The photosensitive conductive film according to claim 1, wherein the conductive fiber is at least one selected from a group consisting of gold fiber, silver fiber, platinum fiber and carbon nanotube.

6. The photosensitive conductive film according to claim 1, wherein a fiber diameter of the conductive fiber is 1 nm to 50 nm.

7. The photosensitive conductive film according to claim 1, wherein the binder polymer includes an acrylic resin.

8. The photosensitive conductive film according to claim 7, wherein the acrylic resin has as constituent units monomer units derived from (meth)acrylic acid and a (meth)acrylic acid alkyl ester.

9. The photosensitive conductive film according to claim 1, wherein the content of a carboxyl group contained in the binder polymer in terms of the ratio of a polymerizable monomer having a carboxyl group to the total polymerizable monomers used, is 12 to 50% by mass.

10. The photosensitive conductive film according to claim 1, wherein the support film is made of a material selected from the group consisting of polyethylene terephthalate, polyethylene, polypropylene and a polycarbonate.

11. The photosensitive conductive film according to claim 1, further comprising a protection film contacting a surface of the photosensitive resin layer opposite the surface thereof facing the support film.

12. A method for forming a conductive film, comprising:
   a lamination step of laminating the photosensitive conductive film according to claim 1 so that the photosensitive resin layer is tightly attached onto a substrate; and
   an exposure step of irradiating a predetermined part of the photosensitive resin layer on the substrate with actinic light.

13. A conductive film substrate comprising a substrate and a conductive film formed on the substrate by the method for forming a conductive film according to claim 12.

14. The conductive film substrate according to claim 13, wherein a surface resistivity of the conductive film is 2000 Ω/square or less.

15. A method for forming a conductive film, comprising:
obtaining a photosensitive conductive film by coating onto a support film a conductive fiber dispersion liquid containing conductive fiber and at least one of water and an organic solvent followed by drying, and then by coating thereon a photosensitive resin composition solution followed by drying;
laminating the photosensitive conductive film so that a surface of said photosensitive conductive film opposite to said support film is tightly attached onto a substrate; and
exposing the laminated photosensitive conductive film by irradiating the laminated photosensitive conductive film with an active light ray.

16. The method for forming a conductive film according to claim 15, wherein said substrate is a glass substrate or a plastic substrate.

17. A method for forming a conductive pattern, comprising:
obtaining a photosensitive conductive film by coating onto a support film a conductive fiber dispersion liquid containing conductive fiber and at least one of water and an organic solvent followed by drying, and then by coating thereon a photosensitive resin composition solution followed by drying;
laminating the photosensitive conductive film so that a surface of said photosensitive conductive film opposite to said support film is tightly attached onto a substrate;
irradiating the laminated photosensitive conductive film with an active light ray; and
then, developing the exposed laminated photosensitive conductive film to form a conductive pattern.

18. The method for forming a conductive pattern according to claim 17, wherein said developing is performed using an alkaline aqueous solution.

19. The method for forming a conductive pattern according to claim 18, wherein said alkaline aqueous solution has a pH in a range of 9 to 11.

* * * * *